(12) United States Patent
Kimura et al.

(10) Patent No.: US 9,182,452 B2
(45) Date of Patent: Nov. 10, 2015

(54) POWER SUPPLY VOLTAGE MONITORING CIRCUIT, SENSOR CIRCUIT FOR VEHICLE, AND POWER STEERING APPARATUS

(71) Applicant: HITACHI AUTOMOTIVE SYSTEMS STEERING, LTD., Hiki-gun, Saitama (JP)

(72) Inventors: Makoto Kimura, Yokohama (JP); Teruyuki Ohnishi, Atsugi (JP)

(73) Assignee: HITACHI AUTOMOTIVE SYSTEMS STEERING, LTD., Hiki-Gun, Saitama (JP)

( * ) Notice: Subject to any disclaimer, the term of this patent is extended or adjusted under 35 U.S.C. 154(b) by 105 days.

(21) Appl. No.: 14/164,873

(22) Filed: Jan. 27, 2014

(65) Prior Publication Data

US 2014/0229062 A1     Aug. 14, 2014

(30) Foreign Application Priority Data

Feb. 13, 2013   (JP) .................................. 2013-025362

(51) Int. Cl.
| | | |
|---|---|---|
| *G01R 31/40* | (2014.01) | |
| *B62D 5/04* | (2006.01) | |
| *B62D 6/10* | (2006.01) | |
| *B62D 15/02* | (2006.01) | |
| *G01R 31/00* | (2006.01) | |

(52) U.S. Cl.
CPC ................ *G01R 31/40* (2013.01); *B62D 5/049* (2013.01); *B62D 5/0481* (2013.01); *B62D 6/10* (2013.01); *B62D 15/0215* (2013.01); *G01R 31/007* (2013.01)

(58) Field of Classification Search
CPC ...... G01R 31/00; G01R 31/40; G01R 31/007; G01R 19/0038; G01R 19/0046; G01R 19/0069; G01R 19/0084; G01R 19/165; G01R 19/16538; G01R 19/16528; G01R 19/16566; G01R 19/1659; G01R 17/00; G01R 17/02; G01R 17/10; B62D 5/0481–5/0496; B62D 6/10; B62D 15/0215; B62D 5/049; G01F 1/00; G01F 1/10; G01F 1/12; G01F 1/46; G01F 1/462; G01F 1/56; G01F 1/562; G01F 1/565; G01F 1/569; G01F 1/571; G01F 1/573; G01F 1/577; G01F 1/59; G01F 1/625; G06F 11/00; G06F 11/14; G06F 11/1415; G06F 11/142; G06F 11/1428; G06F 11/16; G06F 11/1608; G06F 11/1629–11/1654; G06F 11/202–11/2051; G06F 11/3058; G06F 11/07; G06F 11/20

See application file for complete search history.

(56) References Cited

FOREIGN PATENT DOCUMENTS

JP          2005-208939 A      8/2005

*Primary Examiner* — Khoi Tran
*Assistant Examiner* — Adam Mott
(74) *Attorney, Agent, or Firm* — Foley & Lardner LLP

(57) ABSTRACT

First and second microcomputers are connected to a ground. A first reference voltage generation circuit is connected between a first power supply and the first microcomputer, and supplies a first reference voltage to the first microcomputer when voltage of the first power supply is higher than the first reference voltage. A first monitoring circuit is connected between a second power supply and the first microcomputer, and supplies the first microcomputer with a first monitoring voltage for monitoring the second power supply. The first microcomputer includes a part configured to perform an operation based on the supplied first reference voltage and the supplied first monitoring voltage, wherein the operation includes detecting abnormality in the voltages of the first and second power supplies, and determining which one of the voltage of the first power supply and the voltage of the second power supply is abnormal.

20 Claims, 8 Drawing Sheets

FIG.9

| | | First Power Supply Voltage | | Second Power Supply Voltage | | Ground | | First Reference Voltage | | Second Reference Voltage | |
|---|---|---|---|---|---|---|---|---|---|---|---|
| First Microcomputer | First Reference Voltage | ↗ | ↗ | ↗ | — | ↗ | — | ↖ | ↗ | ↗ | — |
| | First Monitoring Voltage | ↖ | — | — | — | — | — | ↖ | — | — | — |
| Second Microcomputer | Second Reference Voltage | — | ↗ | ↖ | ↗ | ↗ | — | — | — | — | — |
| | Second Monitoring Voltage | ↗ | — | ↖ | ↗ | — | — | — | — | ↖ | — |

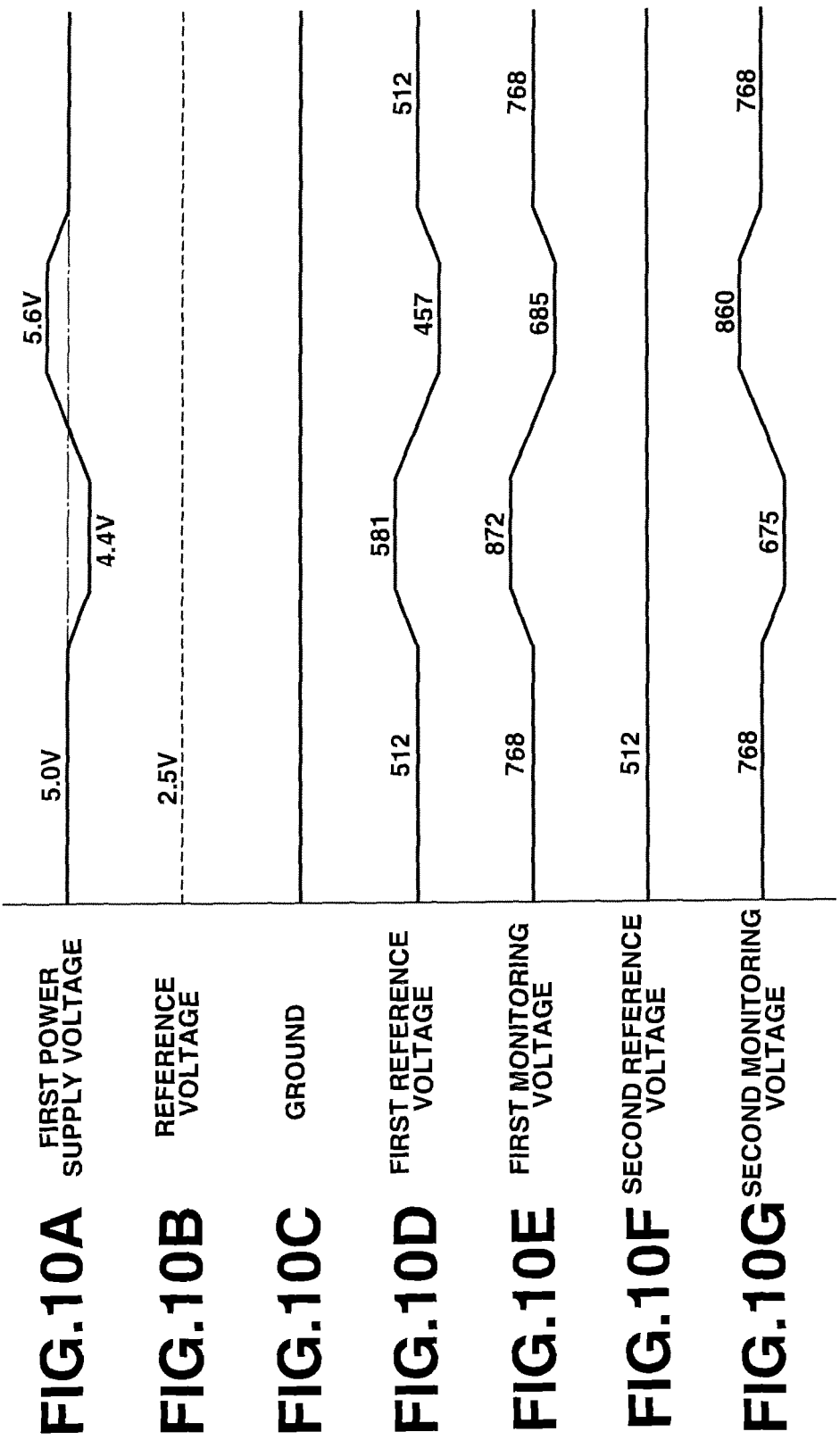

POWER SUPPLY VOLTAGE MONITORING CIRCUIT, SENSOR CIRCUIT FOR VEHICLE, AND POWER STEERING APPARATUS

BACKGROUND OF THE INVENTION

The present invention relates to a power supply voltage monitoring circuit, a sensor circuit for a vehicle, and a power steering apparatus.

Japanese Patent Application Publication No. 2005-208939 discloses a microcomputer power supply voltage monitoring system including a power supply monitoring means for monitoring whether or not a voltage supplied from a power supply to a microcomputer is within a proper range of voltage.

SUMMARY OF THE INVENTION

The microcomputer power supply voltage monitoring system of Japanese Patent Application Publication No. 2005-208939 is for a system including a single microcomputer only. For a system including a plurality of microcomputers, it has been proposed to provide a common ground to which the microcomputers are connected, in order to reduce the number of terminals, and thereby reduce the size of the system. However, the provision of the common ground may cause a problem that when one of power supplies supplying electric power to the microcomputers is failed, it is impossible to identify the failed power supply.

In view of the foregoing, it is desirable to provide a power supply voltage monitoring circuit, a sensor circuit for a vehicle, and a power steering apparatus, which are capable of detecting an abnormality in power supplies that supply electric power to microcomputers connected to a common ground.

According to one aspect of the present invention, a power supply voltage monitoring circuit comprises: a first microcomputer including a first microprocessor and a first interface, wherein the first microcomputer is connected to a ground, and configured to control an external load, wherein the external load is configured to operate with receipt of electric power supply; a second microcomputer including a second microprocessor and a second interface, wherein the second microcomputer is connected to the ground, and configured to control the external load; a first power supply configured to supply electric power to the first microcomputer; a second power supply configured to supply electric power to the second microcomputer; a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage; wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

According to another aspect of the present invention, a sensor circuit for a vehicle, comprises: a sensor configured to sense a state of operation of the vehicle; a first microcomputer including a first microprocessor and a first interface, wherein the first microcomputer is connected to a ground, and configured to control the sensor; a second microcomputer including a second microprocessor and a second interface, wherein the second microcomputer is connected to the ground, and configured to control the sensor; a first power supply configured to supply electric power to the first microcomputer; a second power supply configured to supply electric power to the second microcomputer; a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage; wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

According to a further aspect of the present invention, a power steering apparatus comprises: a steering mechanism configured to steer a steered wheel in accordance with steering operation of a steering wheel; an electric motor configured to apply a steering force to the steering mechanism; a sensor configured to sense a state of steering of the steering mechanism; a motor control circuit configured to control drive of the electric motor based on the sensed state of steering of the steering mechanism; a first microcomputer including a first microprocessor and a first interface, wherein the first microcomputer is connected to a ground, and configured to control the sensor; a second microcomputer including a second microprocessor and a second interface, wherein the second microcomputer is connected to the ground, and configured to control the sensor; a first power supply configured to supply electric power to the first microcomputer; a second power supply configured to supply electric power to the second microcomputer; a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage; wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

BRIEF DESCRIPTION OF THE DRAWINGS

FIG. 9 is a table showing a relationship between each of sensed values of reference voltages and monitoring voltages and each of actual voltages of components of the circuit of FIG. 6.

FIGS. 10A, 10B, 10C, 10D, 10E, 10F and 10G are time charts showing changes of sensed values of reference voltages and monitoring voltages under a condition where the voltage of a first sensor power supply rises or falls abnormally in the circuit of FIG. 6.

DETAILED DESCRIPTION OF THE INVENTION

First Embodiment

Figure 1:
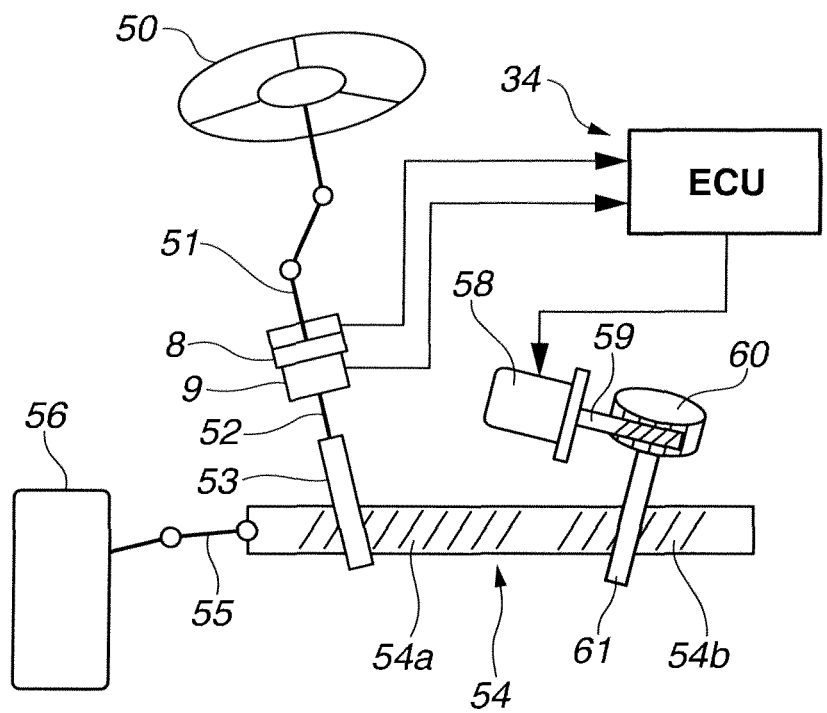
FIG. 1 is a schematic diagram showing system configuration of a power steering apparatus of an automotive vehicle according to a first embodiment of the present invention.
Figure 2:
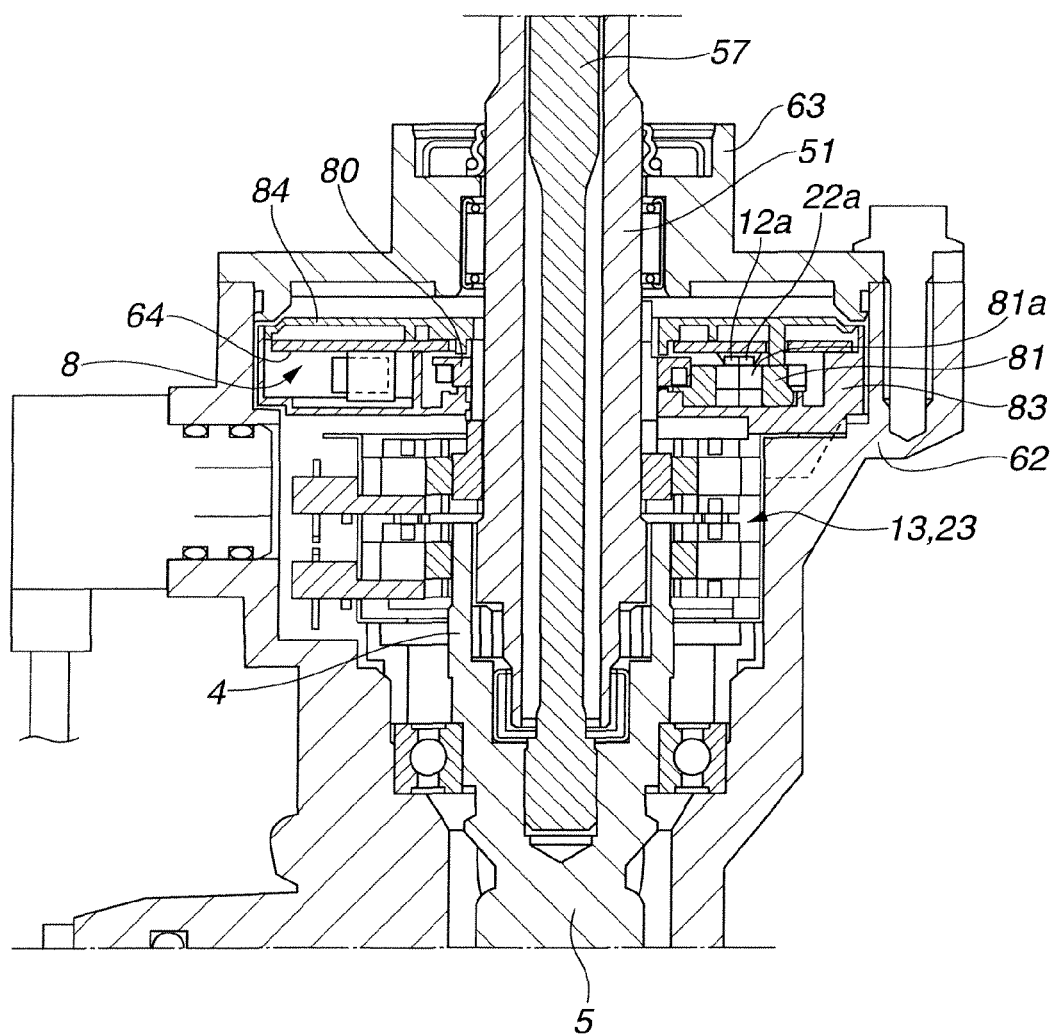
FIG. 2 is a sectional view of a part of the power steering apparatus of FIG. 1, wherein the part includes a steering angle sensor and a steering torque sensor.

[Configuration of Power Steering Apparatus] The following describes a power steering apparatus 1 according to a first embodiment of the present invention with reference to FIGS. 1 and 2. As shown in FIG. 1, power steering apparatus 1 includes a steering wheel 50, an input shaft 51, an output shaft 52, a first pinion shaft 53, a rack bar 54, a tie rod 55, and a steered wheel 56. Input shaft 51 is connected to steering wheel 50. Output shaft 52 is connected to input shaft 51. First pinion shaft 53 is connected to output shaft 52. Rack bar 54 is meshed with first pinion shaft 53. Tie rod 55 is linked to an end portion of rack bar 54. Steered wheel 56 is connected to tie rod 55. Rack bar 54 includes a first rack tooth portion 54a meshed with first pinion shaft 53. Input shaft 51 and output shaft 52 are provided with a torsion bar 57 therebetween as shown in FIG. 2, so that input shaft 51 and output shaft 52 are rotatable with respect to each other within a range of torsion of torsion bar 57.

The power steering apparatus is provided with a steering assist mechanism to assist a steering force of steering wheel 50. The steering assist mechanism includes an electric motor 58, a worm shaft 59, a worm wheel 60, and a second pinion 61. Worm shaft 59 is connected to an output shaft of electric motor 58. Worm wheel 60 is meshed with worm shaft 59. Second pinion 61 is connected to worm wheel 60. Second pinion 61 is meshed with a second rack tooth portion 54b of rack bar 54.

The power steering apparatus is provided with a steering angle sensor 8 at the outer periphery of input shaft 51 for sensing the steering angle of steering wheel 50. The power steering apparatus is also provided with a steering torque sensor 9 between input shaft 51 and output shaft 52 for sensing a steering torque inputted to steering wheel 50. The power steering apparatus includes an electronic control unit 34 for controlling operation of electric motor 58.

Figure 3:
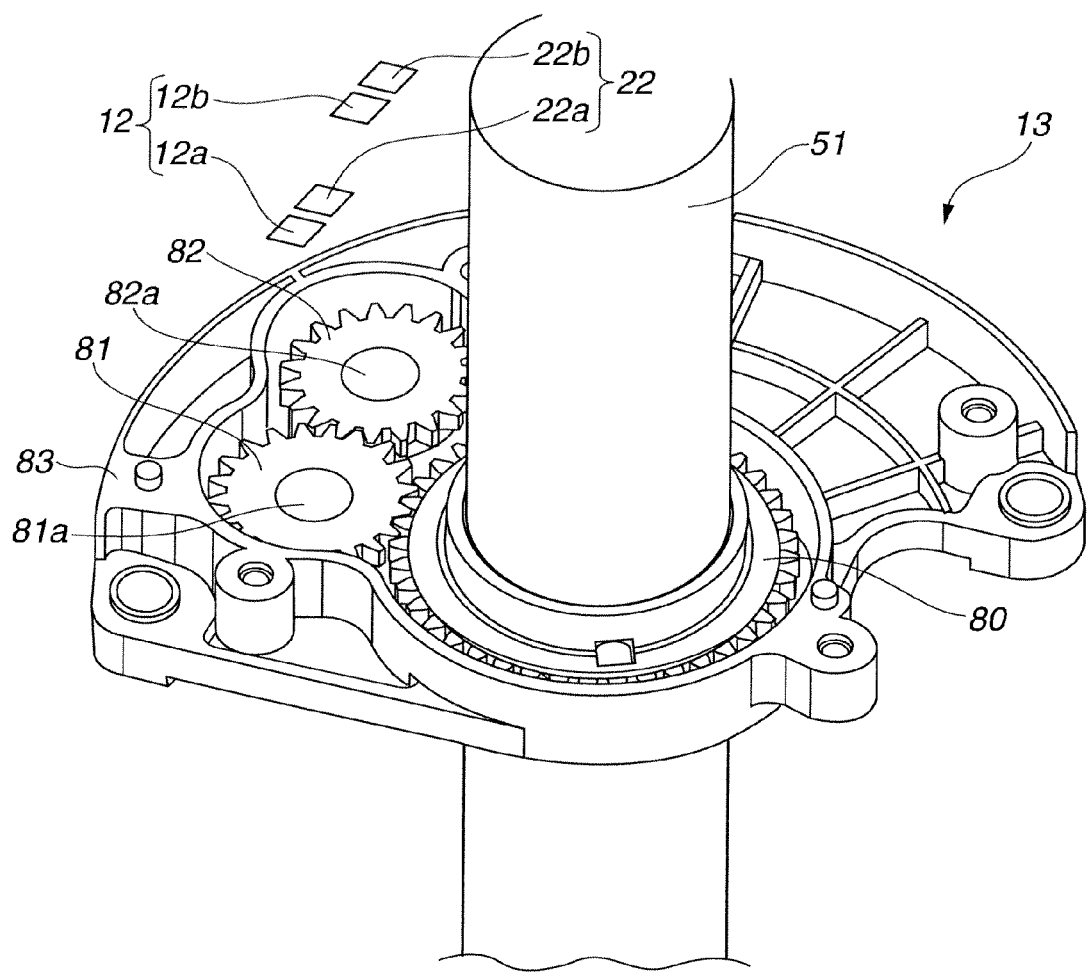
FIG. 3 is an exploded perspective view of a part of the power steering apparatus of FIG. 1, wherein the part includes the steering angle sensor.

[Configuration of Steering Angle Sensor] The following describes configuration of steering angle sensor 8 with reference to FIGS. 2 and 3. As shown in FIG. 2, steering angle sensor 8 includes a main gear 80, a primary detection gear 81, and a secondary detection gear 82. Main gear 80 is fixed to input shaft 51 so that main gear 80 and input shaft 51 rotate as a unit. Primary detection gear 81 is meshed with main gear 80. Secondary detection gear 82 is meshed with primary detection gear 81. Main gear 80 is rotatably mounted in a steering angle sensor housing 83. Main gear 80 is an external gear, which has forty teeth in this example.

Primary detection gear 81 is rotatably mounted in steering angle sensor housing 83. Primary detection gear 81 includes a magnetic member 81a having a pair of a north pole and a south pole. Magnetic member 81a may be configured to have two or more pairs of a north pole and south pole, if the north poles and south poles are magnetized at a predetermined interval. Primary detection gear 81 is an external gear, which has twenty teeth in this example. Primary detection gear 81 is meshed with main gear 80. Secondary detection gear 82 is rotatably mounted in steering angle sensor housing 83. Secondary detection gear 82 includes a magnetic member 82a having a pair of a north pole and a south pole. Magnetic member 82a may be configured to have two or more pairs of a north pole and south pole, if the north poles and south poles are magnetized at a predetermined interval. Secondary detection gear 82 is an external gear, which has nineteen teeth in this example. The number of teeth of secondary detection gear 82 and the number of teeth of a tooth portion 81b of primary detection gear 81 are set to be indivisible by each other. Secondary detection gear 82 is meshed with primary detection gear 81.

A first rotation angle sensor 12 is provided to sense a rotation angle of primary detection gear 81, whereas a second rotation angle sensor 22 is provided to sense a rotation angle of secondary detection gear 82. First rotation angle sensor 12 includes a magnetoresistive effect element 12a and a magnetoresistive effect element 12b which are located to face the magnetic member 81a, and configured to sense the rotation angle of primary detection gear 81 based on change of the magnetic field due to rotation of primary detection gear 81. Similarly, second rotation angle sensor 22 includes a magnetoresistive effect element 22a and a magnetoresistive effect element 22b which are located to face the magnetic member 82a, and configured to sense the rotation angle of secondary detection gear 82 based on change of the magnetic field due to rotation of secondary detection gear 82. The components of steering angle sensor 8 are mounted in steering angle sensor housing 83. Steering angle sensor housing 83 has an opening at one side. The components of steering angle sensor 8 are installed in steering angle sensor housing 83, and then a circuit board 64 is installed closer to the opening of steering angle sensor housing 83, and the opening of steering angle sensor housing 83 is covered by a steering angle sensor cover 84.

[Configuration of Steering Torque Sensor] The following describes configuration of steering torque sensor 9 with reference to FIG. 2. Steering torque sensor 9 includes a first torque sensor 13 and a second torque sensor 23 for sensing a torque based on a difference in rotation angle between input shaft 51 and output shaft 52. Steering torque sensor 9 has a redundant system based on first torque sensor 13 and second torque sensor 23. Steering angle sensor 8 and steering torque sensor 9 are installed in a gear housing 62 as well as first pinion shaft 53, and an opening of gear housing 62 is covered by a gear cover 63.

Figure 4:
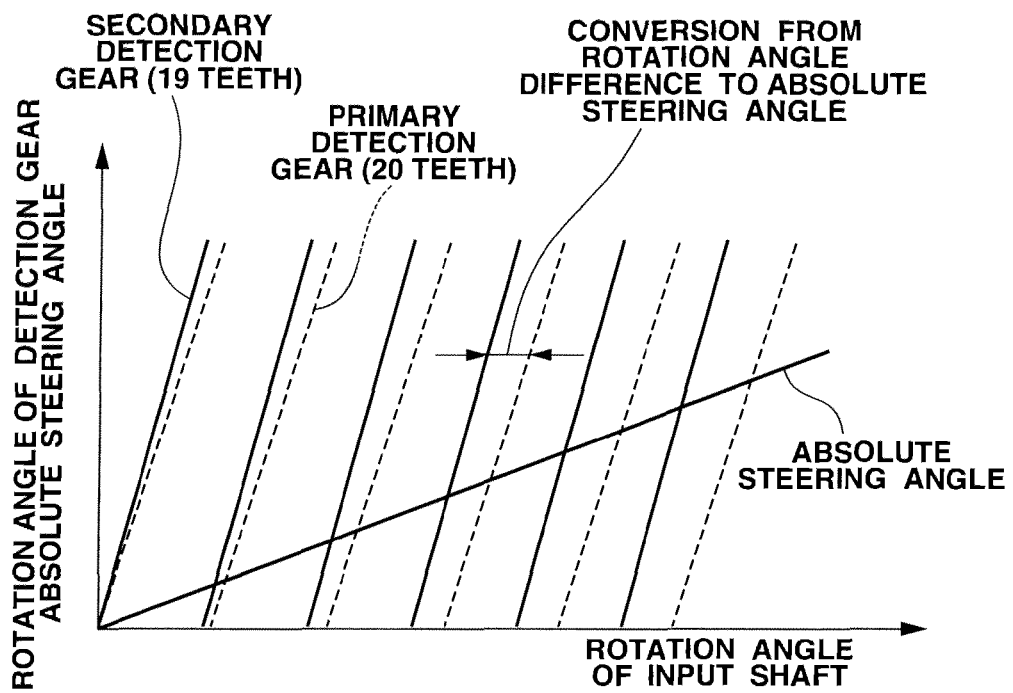
FIG. 4 is a graphic diagram showing a relationship between a rotation angle of a steering shaft and rotation angles of a primary detection gear and a secondary detection gear in the power steering apparatus of FIG. 1.

[How to Determine Steering Angle] FIG. 4 shows a relationship between the rotation angle of input shaft 51 and rotation angles of primary detection gear 81 and secondary detection gear 82 in the power steering apparatus of FIG. 1. First rotation angle sensor 12 outputs a sine wave signal or cosine wave signal indicating a magnetoresistive change of the magnetic field of magnetic member 81a due to the rotational position of primary detection gear 81, whereas second rotation angle sensor 22 outputs a sine wave signal or cosine wave signal indicating a magnetoresistive change of the magnetic field of magnetic member 82a due to the rotational position of secondary detection gear 82. The sine wave signals or cosine wave signals are converted into rotation angle information which is shown in FIG. 4. As shown in FIG. 4, while primary detection gear 81 having twenty teeth rotates once (360 degrees), secondary detection gear 82 rotates once and more (more than 360 degrees). Until secondary detection gear 82 has rotated twenty times, the difference in rotation angle between secondary detection gear 82 and primary detection gear 81 increases gradually. The difference in rotation angle can be used to determine an absolute steering angle (the rotation angle of input shaft 51 defined also beyond 360 degrees).

Figure 5:
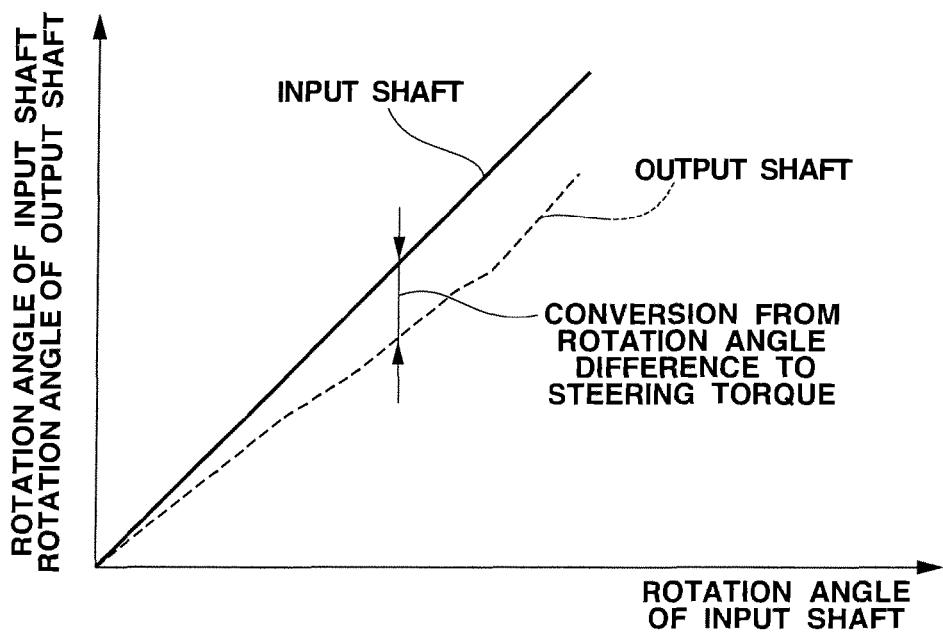
FIG. 5 is a graphic diagram showing a relationship between a rotation angle of an input shaft and sensed angles obtained by a first torque sensor and a second torque sensor in the power steering apparatus of FIG. 1.

[How to Determine Steering Torque] FIG. 5 shows a relationship between the rotation angle of input shaft 51 and sensed rotation angles of input shaft 51 and output shaft 52 obtained by first torque sensor 13 and second torque sensor 23. Each of first torque sensor 13 and second torque sensor 23 outputs a change of magnetic flux density due to rotation angle difference between input shaft 51 and output shaft 52. Since torsion bar 57 is provided between input shaft 51 and output shaft 52, a steering torque inputted to steering wheel 50 causes a torsion of torsion bar 57, and thereby causes a difference in rotation angle between input shaft 51 and output shaft 52. The steering torque can be determined by multiplying the sensed rotation angle difference by the Young's modulus.

Figure 6:
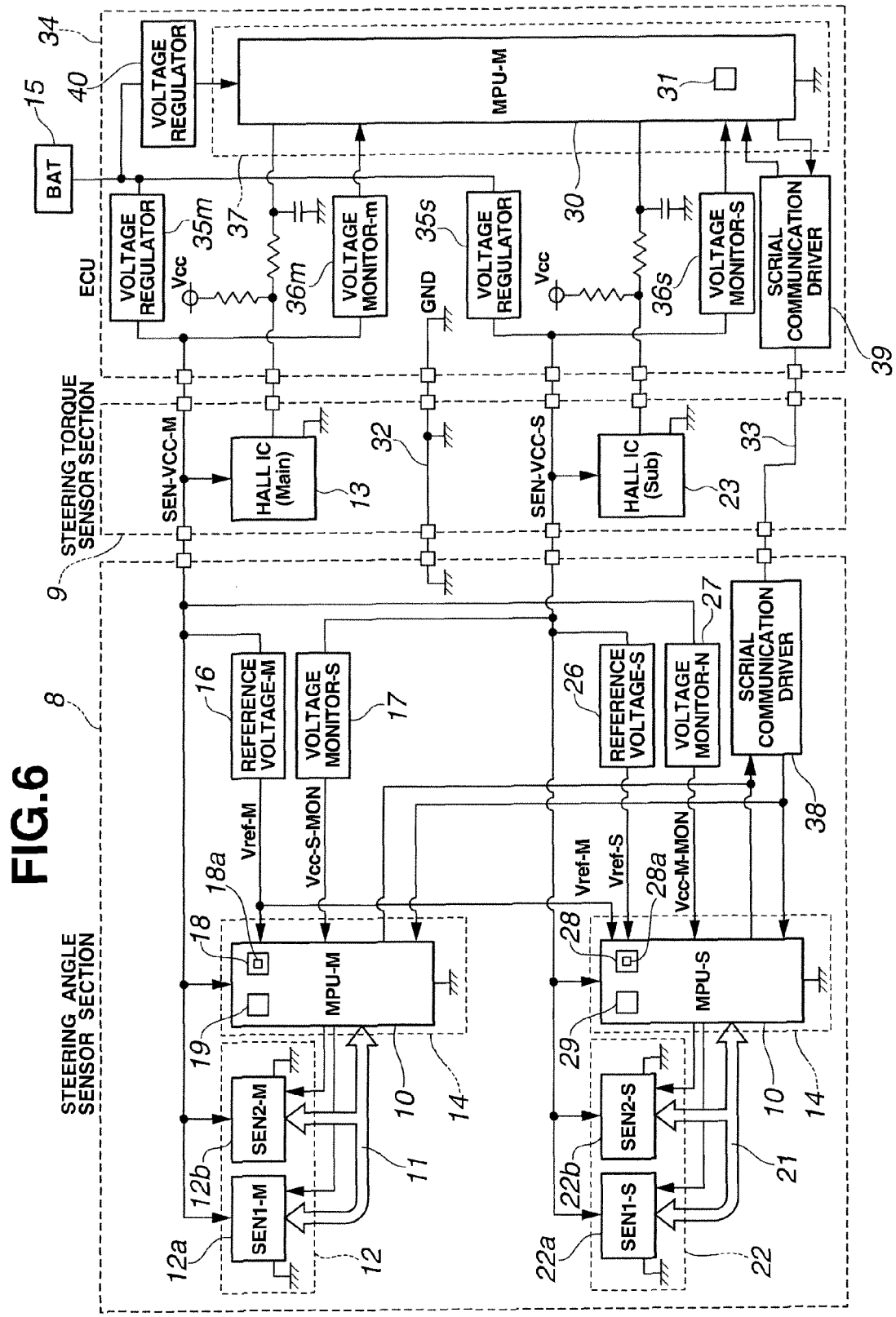
FIG. 6 is a block diagram showing a circuit of the power steering apparatus of FIG. 1.

[Configuration of Circuit] FIG. 6 is a block diagram showing a circuit of the power steering apparatus of FIG. 1, which includes steering angle sensor 8, steering torque sensor 9, and electronic control unit 34.

<Circuit Configuration of Steering Angle Sensor> Steering angle sensor 8 is provided with a first microcomputer 14 and a second microcomputer 24. First microcomputer 14 includes a microprocessor 10 and an interface 11, whereas second microcomputer 24 includes a microprocessor 20 and an interface 21. First microcomputer 14 and second microcomputer 24 are grounded to a common ground 32.

First microcomputer 14 is configured to control first rotation angle sensor 12, whereas second microcomputer 24 is configured to control second rotation angle sensor 22. First microcomputer 14 and first rotation angle sensor 12 are configured to receive supply of electric power through a first sensor power supply 35m from a power supply 15 connected to electronic control unit 34. Second microcomputer 24 and second rotation angle sensor 22 are configured to receive supply of electric power through a second sensor power supply 35s from power supply 15. In this way, a redundant system is composed where two rotation angle sensors 12, 22 are provided, and controlled by respective microcomputers 14, 24, and supplied with electric power by respective sensor power supplies 35m, 35s. Sensor power supplies 35m, 35s may be replaced with a single sensor power supply which distributes electric power to rotation angle sensors 12, 22.

A first reference voltage generation circuit 16 is connected between first sensor power supply 35m and first microcomputer 14. First reference voltage generation circuit 16 is configured to supply electric power of a first reference voltage Vref-M to first microcomputer 14 and second microcomputer 24, when the supply voltage from first sensor power supply 35m is higher than a threshold value that is a nominal value of first reference voltage Vref-M, wherein first reference voltage Vref-M is equal to 2.5 [V] in this example. A first monitoring circuit 17 is connected between second sensor power supply 35s and first microcomputer 14. First monitoring circuit 17 is configured to supply electric power of a first monitoring voltage Vcc-S-MON to first microcomputer 14, wherein first monitoring voltage Vcc-S-MON is equal to 3.75 [V] in this example. The first reference voltage Vref-M (2.5 [V]) and the first monitoring voltage Vcc-S-MON (3.75 [V]) are set different from each other. The first monitoring voltage Vcc-S-MON (3.75 [V]) is set lower than the supply voltage of first sensor power supply 35m (5 [V]).

Figure 7:
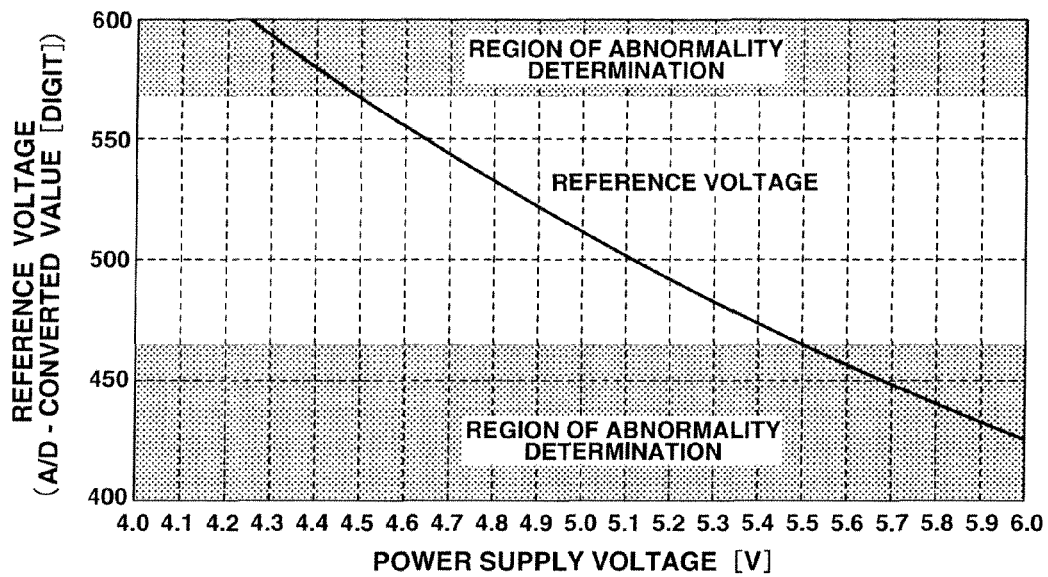
FIG. 7 is a graphic diagram showing a region where a supplied first reference voltage is determined to be normal by a comparator of the power steering apparatus of FIG. 1.
Figure 8:
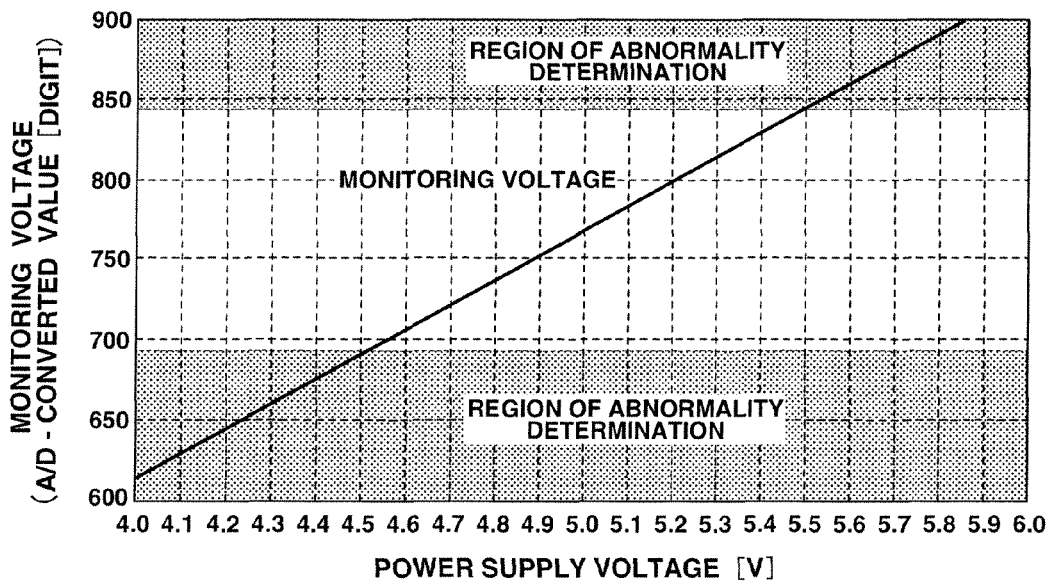
FIG. 8 is a graphic diagram showing a region where a supplied first monitoring voltage is determined to be normal by the comparator of the power steering apparatus of FIG. 1.

First microcomputer 14 includes a first voltage abnormality determination part 18. First voltage abnormality determination part 18 is configured to determine whether or not an abnormality is present in one of first sensor power supply 35m and second sensor power supply 35s, based on the first reference voltage Vref-M and the first monitoring voltage Vcc-S-MON. First voltage abnormality determination part 18 includes a comparator 18a configured to compare the first reference voltage Vref-M and the first monitoring voltage Vcc-S-MON alternately. FIG. 7 is a graphic diagram showing a region where the first reference voltage Vref-M is determined to be normal by comparator 18a. The vertical axis of the graph of FIG. 7 indicates a sensed value of the first reference voltage Vref-M in the form of A/D-converted value. Comparator 18a is configured to determine that the first reference voltage Vref-M is normal when the first reference voltage Vref-M is within a range from 475 [Digit] to 575 [Digit], and determine that the first reference voltage Vref-M is abnormal when the first reference voltage Vref-M is out of the range. FIG. 8 is a graphic diagram showing a region where the first monitoring voltage Vcc-S-MON is determined to be normal by comparator 18a. The vertical axis of the graph of FIG. 8 indicates a sensed value of the first monitoring voltage Vcc-S-MON in the form of A/D-converted value. Comparator 18a is configured to determine that the first monitoring voltage Vcc-S-MON is normal when the first monitoring voltage Vcc-S-MON is within a range from 699 [Digit] to 849 [Digit], and determine that the first monitoring voltage Vcc-S-MON is abnormal when the first monitoring voltage Vcc-S-MON is out of the range. In this way, the range of normality determination of the first reference voltage Vref-M and the range of normality determination of the first monitoring voltage Vcc-S-MON are set separated from each other with no overlap. First microcomputer 14 includes a first reference voltage monitoring circuit 19 configured to monitor the first reference voltage Vref-M.

A second reference voltage generation circuit 26 is connected between second sensor power supply 35s and second microcomputer 24. Second reference voltage generation circuit 26 is configured to supply electric power of a second reference voltage Vref-S to second microcomputer 24, when the supply voltage from second sensor power supply 35s is higher than a threshold value that is a nominal value of second reference voltage Vref-S, wherein second reference voltage Vref-S is equal to 2.5 [V] in this example. A second monitoring circuit 27 is connected between first sensor power supply 35m and second microcomputer 24. Second monitoring circuit 27 is configured to supply electric power of a second monitoring voltage Vcc-M-MON to second microcomputer 24, wherein second monitoring voltage Vcc-M-MON is equal to 3.75 [V] in this example. The second reference voltage Vref-S (2.5 [V]) and the first monitoring voltage Vcc-M-MON (3.75 [V]) are set different from each other. The second monitoring voltage Vcc-M-MON (3.75 [V]) is set lower than the supply voltage of second sensor power supply 35s (5 [V]).

Second microcomputer 24 includes a second voltage abnormality determination part 28. Second voltage abnormality determination part 28 is configured to determine whether or not an abnormality is present in one of first sensor power supply 35m and second sensor power supply 35s, based on the second reference voltage Vref-S and the second monitoring voltage Vcc-M-MON. Second voltage abnormality determination part 28 includes a comparator 28a configured to compare the second reference voltage Vref-S and the second monitoring voltage Vcc-M-MON alternately. In comparator 28a, the range of normality determination of the second reference voltage Vref-S and the range of normality determination of the first monitoring voltage Vcc-M-MON are set separated from each other with no overlap.

Second microcomputer 24 includes a third voltage abnormality determination part 29. Third voltage abnormality determination part 29 is configured to determine whether or not an abnormality is present in one of first sensor power supply 35m and second sensor power supply 35s, based on the first reference voltage Vref-M and the second monitoring voltage Vcc-M-MON. First microcomputer 14 and second microcomputer 24 are connected to a cable 33 through a serial communication driver 38. The signal from first microcomputer 14 and the signal from second microcomputer 24 are sent to a third microcomputer 37 through cable 33.

<Circuit Configuration of Steering Torque Sensor> Steering torque sensor 9 includes first torque sensor 13 and second torque sensor 23. First torque sensor 13 is controlled by first microcomputer 14 of steering angle sensor 8, whereas second torque sensor 23 is controlled by second microcomputer 24 of steering angle sensor 8. First torque sensor 13 receives supply of electric power from first sensor power supply 35m, whereas second torque sensor 23 receives supply of second sensor power supply 35s. In this way, a redundant system is provided where two torque sensors 13, 23 are provided, and controlled respective microcomputers 14, 24, and supplied with electric power by respective sensor power supplies 35m, 35s.

<Circuit Configuration of Electronic Control Unit> Electronic control unit 34 includes third microcomputer 37. Electronic control unit 34 further includes first sensor power supply 35m and second sensor power supply 35s as electric power supply parts. First sensor power supply 35m and second sensor power supply 35s are connected to external power supply 15. A first sensor power supply voltage monitoring circuit 36m is connected between first sensor power supply 35m and third microcomputer 37, whereas a second sensor power supply voltage monitoring circuit 36s is connected between second sensor power supply 35s and third microcomputer 37. First sensor power supply voltage monitoring circuit 36m is configured to detect an abnormality in first sensor power supply 35m, whereas second sensor power supply voltage monitoring circuit 36s is configured to detect an abnormality in second sensor power supply 35s. Third microcomputer 37 includes a comparison circuit 31 configured to detect an abnormality in the first reference voltage Vref-M or the second reference voltage Vref-S, by comparison between the first reference voltage Vref-M and the second reference voltage Vref-S.

Electronic control unit 34 is configured to control electric motor 58 based on information from steering angle sensor 8 and steering torque sensor 9. When first voltage abnormality determination part 18 or second voltage abnormality determination part 28 has detected an abnormality in one of the voltage of first sensor power supply 35m and the voltage of second sensor power supply 35s, the drive control of electric motor 58 is continued based on the output of one of the combination of first rotation angle sensor 12 and first torque sensor 13 and the combination of second rotation angle sensor 22 and second torque sensor 23 to which electric power is supplied with the other of the voltage of first sensor power supply 35m and the voltage of second sensor power supply 35s. When an abnormality is present in first sensor power supply 35m and second sensor power supply 35s, electric motor 58 is controlled in a manner that a steering assist force by electric motor 58 is made to gradually decrease. When first voltage abnormality determination part 18 or second voltage abnormality determination part 28 has detected an abnormality in one of the voltage of first sensor power supply 35m and the voltage of second sensor power supply 35s, the sensing values of one of the combination of first rotation angle sensor 12 and first torque sensor 13 and the combination of second rotation angle sensor 22 and second torque sensor 23 to which electric power is supplied with the other of the voltage of first sensor power supply 35m and the voltage of second sensor power supply 35s are assumed to be normal.

[Relationship Between Voltage Change And Sensed Value] FIG. 9 is a table showing a relationship between each of sensed values of reference voltages and monitoring voltages and each of actual voltages of components of the circuit of FIG. 6. In the table of FIG. 9, an arrow in a diagonally upward direction indicates that a corresponding sensed value or actual value is increasing, an arrow in a diagonally downward direction indicates that a corresponding sensed value or actual value is decreasing, and a horizontal line indicates that a corresponding sensed value or actual value is constant.

As shown in FIG. 9, a rise abnormality of the voltage of first sensor power supply 35m, namely, an abnormality that the voltage of first sensor power supply 35m is rising abnormally, can be detected based on detection of a combination of a fall of the sensed value (i.e. A/D-converted value) of first reference voltage Vref-M, a fall of the sensed value (i.e. A/D-converted value) of first monitoring voltage Vcc-S-MON, a constant condition of the sensed value (i.e. A/D-converted value) of second reference voltage Vref-S, and a rise of the sensed value (i.e. A/D-converted value) of second monitoring voltage Vcc-M-MON. On the other hand, a fall abnormality of the voltage of first sensor power supply 35m, namely, an abnormality that the voltage of first sensor power supply 35m is falling abnormally, can be detected based on detection of a combination of a rise of the sensed value (i.e. A/D-converted value) of first reference voltage Vref-M, a rise of the sensed value (i.e. A/D-converted value) of first monitoring voltage Vcc-S-MON, a constant condition of the sensed value (i.e. A/D-converted value) of second reference voltage Vref-S, and a fall of the sensed value (i.e. A/D-converted value) of second monitoring voltage Vcc-M-MON.

A rise abnormality of the voltage of second sensor power supply 35s, namely, an abnormality that the voltage of second sensor power supply 35s is rising abnormally, can be detected based on detection of a combination of a constant condition of the sensed value (i.e. A/D-converted value) of first reference voltage Vref-M, a rise of the sensed value (i.e. A/D-converted value) of first monitoring voltage Vcc-S-MON, a fall of the sensed value (i.e. A/D-converted value) of second reference voltage Vref-S, and a fall of the sensed value (i.e. A/D-converted value) of second monitoring voltage Vcc-M-MON. On the other hand, a fall abnormality of the voltage of second sensor power supply 35s, namely, an abnormality that the voltage of second sensor power supply 35s is falling abnormally, can be detected based on detection of a combination of a constant condition of the sensed value (i.e. A/D-converted value) of first reference voltage Vref-M, a fall of the sensed value (i.e. A/D-converted value) of first monitoring voltage Vcc-S-MON, a rise of the sensed value (i.e. A/D-converted value) of second reference voltage Vref-S, and a rise of the sensed value (i.e. A/D-converted value) of second monitoring voltage Vcc-M-MON.

A rise abnormality of the voltage of ground 32, namely, an abnormality that the voltage of ground 32 is rising abnormally, can be detected based on detection of a combination of a fall of the sensed value (i.e. A/D-converted value) of first reference voltage Vref-M, a constant condition of the sensed value (i.e. A/D-converted value) of first monitoring voltage Vcc-S-MON, a fall of the sensed value (i.e. A/D-converted value) of second reference voltage Vref-S, and a constant condition of the sensed value (i.e. A/D-converted value) of second monitoring voltage Vcc-M-MON.

A rise abnormality of the first reference voltage Vref-M, namely, an abnormality that the first reference voltage Vref-M is rising abnormally, can be detected based on detection of a combination of a rise of the sensed value (i.e. A/D-converted value) of first reference voltage Vref-M, a constant condition of the sensed value (i.e. A/D-converted value) of first monitoring voltage Vcc-S-MON, a constant condition of the sensed value (i.e. A/D-converted value) of second reference voltage Vref-S, and a constant condition of the sensed value (i.e. A/D-converted value) of second monitoring voltage Vcc-M-MON. On the other hand, a fall abnormality of the first reference voltage Vref-M, namely, an abnormality that the first reference voltage Vref-M is falling abnormally, can be detected based on detection of a combination of a fall of the sensed value (i.e. A/D-converted value) of first reference voltage Vref-M, a constant condition of the sensed value (i.e. A/D-converted value) of first monitoring voltage Vcc-S-MON, a constant condition of the sensed value (i.e. A/D-converted value) of second reference voltage Vref-S, and a constant condition of the sensed value (i.e. A/D-converted value) of second monitoring voltage Vcc-M-MON.

A rise abnormality of the second reference voltage Vref-S, namely, an abnormality that second reference voltage Vref-S is rising abnormally, can be detected based on detection of a combination of a constant condition of the sensed value (i.e. A/D-converted value) of first reference voltage Vref-M, a constant condition of the sensed value (i.e. A/D-converted value) of first monitoring voltage Vcc-S-MON, a rise of the sensed value (i.e. A/D-converted value) of second reference voltage Vref-S, and a constant condition of the sensed value (i.e. A/D-converted value) of second monitoring voltage Vcc-M-MON. On the other hand, a fall abnormality of the second reference voltage Vref-S, namely, an abnormality that the second reference voltage Vref-S is falling abnormally, can be detected based on detection of a combination of a constant condition of the sensed value (i.e. A/D-converted value) of first reference voltage Vref-M, a constant condition of the sensed value (i.e. A/D-converted value) of first monitoring voltage Vcc-S-MON, a fall of the sensed value (i.e. A/D-converted value) of second reference voltage Vref-S, and a constant condition of the sensed value (i.e. A/D-converted value) of second monitoring voltage Vcc-M-MON.

An abnormality of each of the voltage of first sensor power supply 35m and the voltage of second sensor power supply 35s may be detected based on detection of a combination of two of the sensed value (i.e. A/D-converted value) of first reference voltage Vref-M, the sensed value (i.e. A/D-converted value) of first monitoring voltage Vcc-S-MON, the sensed value (i.e. A/D-converted value) of second reference voltage Vref-S, and the sensed value (i.e. A/D-converted value) of second monitoring voltage Vcc-M-MON. Namely, only one of first microcomputer 14 and second microcomputer 24 can determine whether nor not an abnormality is present in first sensor power supply 35m or second sensor power supply 35s.

FIG. 10 is a time chart showing changes of sensed values of the reference voltages and the monitoring voltages under a condition where the voltage of first sensor power supply 35m rises or falls abnormally in the circuit of FIG. 6. As shown in FIG. 10, when the voltage of first sensor power supply 35m falls to 4.4 [V], the sensed value (i.e. A/D-converted value) of first reference voltage Vref-M rises to 581 [Digit], and the sensed value (i.e. A/D-converted value) of first monitoring voltage Vcc-S-MON rises to 872 [Digit], and the sensed value (i.e. A/D-converted value) of second reference voltage Vref-S is constant, and the sensed value (i.e. A/D-converted value) of second monitoring voltage Vcc-M-MON falls to 675 [Digit]. Then, when the voltage of first sensor power supply 35m rises to 5.6 [V], the sensed value (i.e. A/D-converted value) of first reference voltage Vref-M falls to 457 [Digit], and the sensed value (i.e. A/D-converted value) of first monitoring voltage Vcc-S-MON falls to 685 [Digit], and the sensed value (i.e. A/D-converted value) of second reference voltage Vref-S is constant, and the sensed value (i.e. A/D-converted value) of second monitoring voltage Vcc-M-MON rises to 860 [Digit].

[Functions] For such a system as in the first embodiment which includes a plurality of microcomputers, it has been proposed to provide a common ground to which the microcomputers are connected, in order to reduce the number of terminals, and thereby reduce the size of the system. However, the provision of the common ground may cause a problem that when one of power supplies supplying electric power to the microcomputers is failed, it is impossible to identify the failed power supply. As a solution, in the first embodiment, first voltage abnormality determination part 18 of first microcomputer 14 is configured to determine whether or not an abnormality is present in first sensor power supply 35m or second sensor power supply 35s, based on the first reference voltage Vref-M supplied from first reference voltage generation circuit 16 and the first monitoring voltage Vcc-S-MON supplied from first monitoring circuit 17.

In the first embodiment, second voltage abnormality determination part 28 of second microcomputer 24 is configured to determine whether or not an abnormality is present in first sensor power supply 35m or second sensor power supply 35s, based on the second reference voltage Vref-S supplied from second reference voltage generation circuit 26 and the second monitoring voltage Vcc-M-MON supplied from second monitoring circuit 27. Accordingly, under the condition that first microcomputer 14 and second microcomputer 24 share the common ground 32, each of first microcomputer 14 and second microcomputer 24 can detect an abnormality in first sensor power supply 35m or second sensor power supply 35s, independently of each other.

In the first embodiment, third microcomputer 37 is provided with comparison circuit 31 that detects an abnormality in the first reference voltage Vref-M or the second reference voltage Vref-S, by comparison between the first reference voltage Vref-M and the second reference voltage Vref-S. Accordingly, third microcomputer 37 can detect an abnormality independently of first microcomputer 14 and second microcomputer 24, even if first microcomputer 14 and second microcomputer 24 are abnormal. This improves the accuracy and reliability of abnormality detection.

In the first embodiment, first microcomputer 14, second microcomputer 24, and third microcomputer 37 are connected through the single cable 33 for alternately sending information from first microcomputer 14 to third microcomputer 37 and sending information from second microcomputer 24 to third microcomputer 37. This serves reduce the number of cables for communication. In the first embodiment, third microcomputer 37 is provided with first sensor power supply voltage monitoring circuit 36m and second sensor power supply voltage monitoring circuit 36s for detecting an abnormality in first sensor power supply 35m and second sensor power supply 35s, respectively. The abnormality in first sensor power supply 35m and second sensor power supply 35s affect operation of first microcomputer 14 and second microcomputer 24. Since first sensor power supply voltage monitoring circuit 36m and second sensor power supply voltage monitoring circuit 36s are provided in third microcomputer 37 of electronic control unit 34 that supplies electric power to first microcomputer 14 and second microcomputer 24, the abnormality detected by first microcomputer 14 or second microcomputer 24 can be identified as an abnormality in first microcomputer 14 or second microcomputer 24, or an abnormality in first sensor power supply 35m or second sensor power supply 35s.

In the first embodiment, first microcomputer 14 is provided with first reference voltage monitoring circuit 19 that monitors the first reference voltage Vref-M. This serves to detect a buildup of voltage of the ground (the occurrence of a voltage in the ground), or an abnormality in first reference voltage generation circuit 16. In the first embodiment, second microcomputer 24 is provided with third voltage abnormality determination part 29 that determines whether or not an abnormality is present in first sensor power supply 35m or second sensor power supply 35s, based on the first reference voltage Vref-M and the second monitoring voltage Vcc-M-MON. Accordingly, second microcomputer 24 can also detect an abnormality in first sensor power supply 35m or second sensor power supply 35s. This serves to enhance the accuracy and reliability of abnormality detection.

In the first embodiment, the first monitoring voltage Vcc-S-MON is set different from the first reference voltage Vref-M, and the second monitoring voltage Vcc-M-MON is set different from the second reference voltage Vref-S. Accordingly, first voltage abnormality determination part 18 can sense changes of the first reference voltage Vref-M and the first monitoring voltage Vcc-S-MON, and second voltage abnormality determination part 28 can sense changes of the second reference voltage Vref-S and the second monitoring voltage Vcc-M-MON. In the first embodiment, the first monitoring voltage Vcc-S-MON is set lower than the voltage of first sensor power supply 35m, and the second monitoring voltage Vcc-M-MON is set lower than the voltage of second sensor power supply 35s. This allows to detect a rise abnormality of the voltage of first sensor power supply 35m and detect a rise abnormality of the voltage of second sensor power supply 35s.

In the first embodiment, first voltage abnormality determination part 18 is provided with comparator 18a that performs abnormality determination by alternately sampling the first reference voltage Vref-M and the first monitoring voltage Vcc-S-MON, wherein the range where the first reference voltage Vref-M is determined to be normal and the range where the first monitoring voltage Vcc-S-MON is determined to be normal are separated without overlapping. When comparator 18a is failed to be held open, comparator 18a fails to perform alternate sampling, and thereby obtains only one of the first reference voltage Vref-M and the first monitoring voltage Vcc-S-MON. If the range where the first reference voltage Vref-M is determined to be normal and the range where the first monitoring voltage Vcc-S-MON is determined to be normal overlap with each other, it is possible that comparator 18a incorrectly determines that both of the first reference voltage Vref-M and the first monitoring voltage Vcc-S-MON are normal. When comparator 18a is failed to be held open, the feature that the range where the first reference voltage Vref-M is determined to be normal and the range where the first monitoring voltage Vcc-S-MON is determined to be normal are separated without overlapping, serves to always determine correctly that one of the first reference voltage Vref-M and the first monitoring voltage Vcc-S-MON is abnormal, because each sensed value can be identified to belong to the first reference voltage Vref-M or the first monitoring voltage Vcc-S-MON. This serves to ensure that an abnormality can be detected also when comparator 18a is failed to be constantly open. This advantageous effect is obtained also with respect to comparator 28a of second voltage abnormality determination part 28.

[Advantageous Effects] The following summarizes features and produced advantageous effects of the first embodiment in the following <1> to <18>.

<1> A power supply voltage monitoring circuit includes: a first microcomputer (14) including a first microprocessor (10) and a first interface (11), wherein the first microcomputer (14) is connected to a ground (32), and configured to control an external load (first rotation angle sensor 12, first torque sensor 13), wherein the external load (12, 13) is configured to operate with receipt of electric power supply; a second microcomputer (24) including a second microprocessor (20) and a second interface (21), wherein the second microcomputer (24) is connected to the ground (32), and configured to control the external load (second rotation angle sensor 22, second torque sensor 23); a first power supply (first sensor power supply 35m) configured to supply electric power to the first microcomputer (14); a second power supply (second sensor power supply 35s) configured to supply electric power to the second microcomputer (24); a first reference voltage generation circuit (16) connected between the first power supply (35m) and the first microcomputer (14), and configured to supply a first reference voltage (Vref-M: 2.5 [V]) to the first microcomputer (14) in response to a condition that voltage of the first power supply (35m) is higher than the first reference voltage (Vref-M); and a first monitoring circuit (17) connected between the second power supply (35s) and the first microcomputer (14), and configured to supply a first monitoring voltage (Vcc-S-MON: 3.75 [V]) to the first microcomputer (14), wherein the first microcomputer (14) is configured to monitor voltage of the second power supply (35s) based on the supplied first monitoring voltage (Vcc-S-MON); wherein the first microcomputer (14) includes a first voltage abnormality determination part (18) configured to perform a first operation based on the supplied first reference voltage (Vref-M) and the supplied first monitoring voltage (Vcc-S-MON), wherein the first operation includes detecting abnormality in the voltage of the first power supply (35m) and the voltage of the second power supply (35s), and determining which one of the voltage of the first power supply (35m) and the voltage of the second power supply (35s) is abnormal. This configuration allows to detect abnormality in the first power supply (35m) and the second power supply (35s) only by the first microcomputer (14) where the ground (32) is common between the first microcomputer (14) and the second microcomputer (24).

<2> The power supply voltage monitoring circuit further includes: a second reference voltage generation circuit (26) connected between the second power supply (35s) and the second microcomputer (24), and configured to supply a second reference voltage (Vref-S: 2.5 [V]) to the second microcomputer (24) in response to a condition that voltage of the second power supply (35s) is higher than the second reference voltage (Vref-S); a second monitoring circuit (27) connected between the first power supply (35m) and the second microcomputer (24), and configured to supply a second monitoring voltage (Vcc-M-MON: 3.75 [V]) to the second microcomputer (24), wherein the second microcomputer (24) is configured to monitor voltage of the first power supply (35m) based on the supplied second monitoring voltage (Vcc-M-MON); and a comparison circuit (31) configured to detect abnormality in the supplied first reference voltage (Vref-M) and the supplied second reference voltage (Vref-S) by comparison between the supplied first reference voltage (Vref-M) and the supplied second reference voltage (Vref-S); wherein the second microcomputer (24) includes a second voltage abnormality determination part (28) configured to perform a second operation based on the supplied second reference voltage (Vref-S) and the supplied second monitoring voltage (Vcc-M-MON), wherein the second operation includes detecting abnormality in the voltage of the first power supply (35m) and the voltage of the second power supply (35s), and determining which one of the voltage of the first power supply (35m) and the voltage of the second power supply (35s) is abnormal. This feature allows to detect abnormality in the first power supply (35m) and the second power supply (35s) by one of the first microcomputer (14) of the second microcomputer (24) independently of each other, where the ground (32) is common between the first microcomputer (14) and the second microcomputer (24). The feature also allows to determine that abnormality is present in the ground (32), in response to a determination that both of the first microcomputer (14) and the second microcomputer (24) are determined to be abnormal.

<3> The power supply voltage monitoring circuit further includes a third microcomputer (37) configured to be supplied with information about the first microcomputer (14) and the second microcomputer (24), wherein the comparison circuit (31) is provided in the third microcomputer (37). Since the abnormality is detected by the third microcomputer (37) other than the first microcomputer (14) and the second microcomputer (24), it is possible to detect the abnormality without influence of abnormality in the first microcomputer (14) and the second microcomputer (24), and thereby enhance the accuracy and reliability of abnormality detection.

<4> The power supply voltage monitoring circuit is configured so that: the first microcomputer (14) and the second microcomputer (24) are connected to the third microcomputer (37) through a cable (33); and a signal from the first microcomputer (14) and a signal from the second microcomputer (24) are alternately sent to the third microcomputer (37) through the cable (33). This feature serves to reduce the number of cables used for communication.

<5> The power supply voltage monitoring circuit is configured so that: the third microcomputer (37) includes a power supply section (first sensor power supply 35m, second sensor power supply 35s, microcomputer power supply 40) configured to receive electric power supplied from an external device (power supply 15) and implement the first power supply (35m) and the second power supply (35s) based on the supplied electric power; and the third microcomputer (37) includes an external device voltage monitoring circuit (first sensor power supply voltage monitoring circuit 36m, second sensor power supply voltage monitoring circuit 36s) configured to detect abnormality in voltage of the supplied electric power. This feature allows to determine whether or not the abnormality detected by the first microcomputer (14) and the second microcomputer (24) is an abnormality in the first microcomputer (14) and the second microcomputer (24) or an abnormality in the first power supply (35m) and the second power supply (35s).

<6> The power supply voltage monitoring circuit further includes a first reference voltage monitoring circuit (19) configured to monitor the supplied first reference voltage (Vref-M: 2.5 [V]). This feature allows to detect a rise of the ground voltage, or an abnormality in the first reference voltage generation circuit (16).

<7> The power supply voltage monitoring circuit further includes a second monitoring circuit (27) connected between the first power supply (35m) and the second microcomputer (24), and configured to supply a second monitoring voltage (Vcc-M-MON: 3.75 [V]) to the second microcomputer (24), wherein the second microcomputer (24) is configured to monitor voltage of the first power supply (35m) based on the supplied second monitoring voltage (Vcc-M-MON); wherein the first reference voltage generation circuit (16) is configured to supply the first reference voltage (Vref-M) to the second microcomputer (24); and the second microcomputer (24) includes a second voltage abnormality determination part (third voltage abnormality determination part 29 in the first embodiment) configured to perform a second operation based on the supplied first reference voltage (Vref-M) and the supplied second monitoring voltage (Vcc-M-MON), wherein the second operation includes detecting abnormality in the voltage of the first power supply (35m) and the voltage of the second power supply (35s), and determining which one of the voltage of the first power supply (35m) and the voltage of the second power supply (35s) is abnormal. Accordingly, also by the second microcomputer (24), it is possible to detect abnormality in the first power supply (35m) and the voltage of the second power supply (35s). This feature enhances the accuracy and reliability of abnormality detection.

<8> The power supply voltage monitoring circuit is configured so that the first monitoring voltage (Vcc-S-MON) is set different from the first reference voltage (Vref-M). This feature allows the first voltage abnormality determination part (18) to detect changes of the first reference voltage (Vref-M) and the first monitoring voltage (Vcc-S-MON) (or allows the second voltage abnormality determination part (28) to detect changes of the second reference voltage (Vref-S) and the second monitoring voltage (Vcc-M-MON).

<9> The power supply voltage monitoring circuit is configured so that the first monitoring voltage (Vcc-S-MON) is set lower than the voltage of the first power supply (35m). This feature allows to detect the rise abnormality of the voltage of the first power supply (35m) (or allows to detect the rise abnormality of the voltage of the second power supply (35s)).

<10> The power supply voltage monitoring circuit is configured so that: the first voltage abnormality determination part (18) includes a comparator (18a) configured to implement the first operation with alternately sampling the supplied first reference voltage (Vref-M) and the supplied first monitoring voltage (Vcc-S-MON); the comparator (18a) is configured to: determine that the supplied first reference voltage (Vref-M) is normal, in response to a condition that the supplied first reference voltage (Vref-M) is within a first region where the supplied first reference voltage (Vref-M) is within a first predetermined range of voltage; determine that the supplied first reference voltage (Vref-M) is abnormal, in response to a condition that the supplied first reference voltage (Vref-M) is out of the first region; determine that the supplied first monitoring voltage (Vcc-S-MON) is normal, in response to a condition that the supplied first monitoring voltage (Vcc-S-MON) is within a second region where the supplied first monitoring voltage (Vcc-S-MON) is within a second predetermined range of voltage; and determine that the supplied first monitoring voltage (Vcc-S-MON) is abnormal, in response to a condition that the supplied first monitoring voltage (Vcc-S-MON) is out of the second region; and the first region and the second region are set separated from each other. This feature allows to detect an abnormality more reliably even when the comparator (18a) is failed to be held opened.

<11> A sensor circuit for a vehicle, includes: a sensor (steering angle sensor 8, steering torque sensor 9) configured to sense a state of operation of the vehicle; a first microcomputer (14) including a first microprocessor (10) and a first interface (11), wherein the first microcomputer (14) is connected to a ground (32), and configured to control the sensor (8, 9); a second microcomputer (24) including a second microprocessor (20) and a second interface (21), wherein the second microcomputer (24) is connected to the ground (32), and configured to control the sensor (8, 9); a first power supply (first sensor power supply 35m) configured to supply electric power to the first microcomputer (14); a second power supply (second sensor power supply 35s) configured supply electric power to the second microcomputer (24); a first reference voltage generation circuit (16) connected between the first power supply (35m) and the first microcomputer (14), and configured to supply a first reference voltage (Vref-M: 2.5 [V]) to the first microcomputer (14) in response to a condition that voltage of the first power supply (35m) is higher than the first reference voltage (Vref-M); and a first monitoring circuit (17) connected between the second power supply (35s) and the first microcomputer (14), and configured to supply a first monitoring voltage (Vcc-S-MON: 3.75 [V]) to the first microcomputer (14), wherein the first microcomputer (14) is configured to monitor voltage of the second power supply (35s) based on the supplied first monitoring voltage (Vcc-S-MON); wherein the first microcomputer (14) includes a first voltage abnormality determination part (18) configured to perform a first operation based on the supplied first reference voltage (Vref-M) and the supplied first monitoring voltage (Vcc-S-MON), wherein the first operation includes detecting abnormality in the voltage of the first power supply (35m) and the voltage of the second power supply (35s), and determining which one of the voltage of the first power supply (35m) and the voltage of the second power supply (35s) is abnormal. This configuration allows to detect abnormality in the first power supply (35m) and the second power supply (35s) only by the first microcomputer (14) where the ground (32) is common between the first microcomputer (14) and the second microcomputer (24).

<12> The sensor circuit is configured so that: the sensor (8, 9) includes a first sensor (first rotation angle sensor 12, first torque sensor 13) and a second sensor (second rotation angle sensor 22, second torque sensor 23); the first microcomputer (14) is configured to control the first sensor (12, 13); the second microcomputer (24) is configured to control the second sensor (22, 23); the first microcomputer (14) is configured to provide the vehicle with a value of the first sensor (12, 13) as a normal value, in response to a condition that the first voltage abnormality determination part (18) has detected abnormality in the voltage of the second power supply (35s); and the second microcomputer (24) is configured to provide the vehicle with a value of the second sensor (22, 23) as a normal value, in response to a condition that the first voltage abnormality determination part (18) has detected abnormality in the voltage of the first power supply (35m). This feature allows to continue the control using the sensed value of the side where no power supply abnormality is present, and thereby expand the region where the vehicle can be controlled.

<13> The sensor circuit is configured so that the sensor is a steering angle sensor (8) configured to sense a rotation angle of a steering wheel (50) of the vehicle. Accordingly, the region where the vehicle can be controlled based on the steering angle information of the steering wheel (50) can be expanded.

<14> The sensor circuit is configured so that the sensor is a torque sensor (9) configured to sense steering torque. Accordingly, the region where the vehicle can be controlled based on the steering torque information of the steering wheel (50) can be expanded.

<15> A power steering apparatus includes: a steering mechanism (rack bar 54) configured to steer a steered wheel (56) in accordance with steering operation of a steering wheel (50); an electric motor (58) configured to apply a steering force to the steering mechanism (54); a sensor (steering angle sensor 8, steering torque sensor 9) configured to sense a state of steering of the steering mechanism (54); a motor control circuit (electronic control unit 34) configured to control drive of the electric motor (58) based on the sensed state of steering of the steering mechanism (54); a first microcomputer (14) including a first microprocessor (10) and a first interface (11), wherein the first microcomputer (14) is connected to a ground (32), and configured to control the sensor (8, 9); a second microcomputer (24) including a second microprocessor (20) and a second interface (21), wherein the second microcomputer (24) is connected to the ground (32), and configured to control the sensor (8, 9); a first power supply (first sensor power supply 35m) configured to supply electric power to the first microcomputer (14); a second power supply (second sensor power supply 35s) configured to supply electric power to the second microcomputer (24); a first reference voltage generation circuit (16) connected between the first power supply (35m) and the first microcomputer (14), and configured to supply a first reference voltage (Vref-M: 2.5 [V]) to the first microcomputer (14) in response to a condition that voltage of the first power supply (35m) is higher than the first reference voltage (Vref-M); and a first monitoring circuit (17) connected between the second power supply (35s) and the first microcomputer (14), and configured to supply a first monitoring voltage (Vcc-S-MON: 3.75 [V]) to the first microcomputer (14), wherein the first microcomputer (14) is configured to monitor voltage of the second power supply (35s) based on the supplied first monitoring voltage (Vcc-S-MON); wherein the first microcomputer (14) includes a first voltage abnormality determination part (18) configured to perform a first operation based on the supplied first reference voltage (Vref-M) and the supplied first monitoring voltage (Vcc-S-MON), wherein the first operation includes detecting abnormality in the voltage of the first power supply (35m) and the voltage of the second power supply (35s), and determining which one of the voltage of the first power supply (35m) and the voltage of the second power supply (35s) is abnormal. This configuration allows to detect abnormality in the first power supply (35m) and the second power supply (35s) only by the first microcomputer (14) where the ground (32) is common between the first microcomputer (14) and the second microcomputer (24).

<16> The power steering apparatus is configured so that: the sensor (8, 9) includes a first sensor (first rotation angle sensor 12, first torque sensor 13) and a second sensor (second rotation angle sensor 22, second torque sensor 23); the first microcomputer (14) is configured to control the first sensor (12, 13); the second microcomputer (24) is configured to control the second sensor (22, 23); the motor control circuit (34) is configured to continue to control drive of the electric motor (58) based on an output of the first sensor (12, 13), in response to a condition that the first voltage abnormality determination part (18) has detected abnormality in the voltage of the second power supply (35s); and the motor control circuit (34) is configured to continue to control drive of the electric motor (58) based on an output of the second sensor (22, 23), in response to a condition that the first voltage abnormality determination part (18) has detected abnormality in the voltage of the first power supply (35m). This feature allows to continue the control using the sensed value of the side where no power supply abnormality is present, and thereby expand the region where the vehicle can be controlled.

<17> The power steering apparatus is configured so that the motor control circuit (34) is configured to gradually reduce an assist force of the electric motor (58), while continuing to control drive of the electric motor (58) based on the output of one of the first sensor (12, 13) and the second sensor (22, 23) in response to the condition that the first voltage abnormality determination part (18) has detected abnormality in one of the voltage of the voltage of the first power supply (35m) and the second power supply (35s). This feature serves to suppress the steering load to the driver from rapidly increasing when an abnormality is detected in the power supply.

<18> The power steering apparatus is configured so that: the sensor (8, 9) includes a steering angle sensor (8) including a first steering angle sensor (first rotation angle sensor 12) and a second steering angle sensor (second rotation angle sensor 22), and a steering torque sensor (9) including a first steering torque sensor (13) and a second steering torque sensor (23); the first steering angle sensor (12) and the first steering torque sensor (13) are driven by the first power supply (35m); and the second steering angle sensor (22) and the second steering torque sensor (23) are driven by the second power supply (35s). Accordingly, the first voltage abnormality determination part (18) can be allocated to both of the first steering angle sensor (12) and the first steering torque sensor (13), and the second voltage abnormality determination part (28) can be allocated to both of the second steering angle sensor (22) and the second steering torque sensor (23).

Other Embodiments

The first embodiment may be modified variously as follows. Although magnetoresistive effect elements 12a, 12b, 22a, 22b are employed for detecting changes of the magnetic field of magnetic member 81a, 82a in the first embodiment, magnetoresistive effect elements 12a, 12b, 22a, 22b may be replaced with giant magnetoresistive effect (GMR) elements or Hall effect elements. First microcomputer 14 and second microcomputer 24 may be placed in two separate chips, or may be placed in a single chip to form a multi-core microcomputer.

In the first embodiment, comparator 18a of first voltage abnormality determination part 18 is configured to compare the first reference voltage Vref-M and first monitoring voltage Vcc-S-MON alternately. Comparator 18a may be configured to sample a third voltage different from the first reference voltage Vref-M and first monitoring voltage Vcc-S-MON, while sampling the first reference voltage Vref-M and first monitoring voltage Vcc-S-MON. When in a failed state to be held opened, comparator 18a performs sampling of only one of the first reference voltage Vref-M and first monitoring voltage Vcc-S-MON. If the first reference voltage Vref-M and first monitoring voltage Vcc-S-MON are set equal or close to each other, first voltage abnormality determination part 18 may incorrectly recognize that both of the first reference voltage Vref-M and first monitoring voltage Vcc-S-MON are normal. The feature that comparator 18a is configured to sample a third voltage different from the first reference voltage Vref-M and first monitoring voltage Vcc-S-MON, while sampling the first reference voltage Vref-M and first monitoring voltage Vcc-S-MON, serves to detect the occurrence of an abnormality based on a condition that the third voltage fails to be detected when comparator 18a is failed to be held open. Comparator 28a of second voltage abnormality determination part 28 may be modified similarly. In the case of this modification, the first reference voltage Vref-M and first monitoring voltage Vcc-S-MON may be set equal or close to each other, where the region of normality determination of first reference voltage Vref-M and the region of normality determination of first monitoring voltage Vcc-S-MON overlap with each other.

In the first embodiment, third microcomputer 37 is provided with comparison circuit 31 configured to detect abnormality in the first reference voltage Vref-M and the second reference voltage Vref-S, based on comparison between the first reference voltage Vref-M and the second reference voltage Vref-S. Comparison circuit 31 may be provided in each of first microcomputer 14 and second microcomputer 24 so that the first reference voltage Vref-M and the second reference voltage Vref-S are cross-monitored by second microcomputer 24 and first microcomputer 14, respectively. This configuration allows mutual monitoring between first microcomputer 14 and second microcomputer 24 without provision of third microcomputer 37.

The entire contents of Japanese Patent Application 2013-025362 filed Feb. 13, 2013 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A power supply voltage monitoring circuit comprising:
a first microcomputer including a first microprocessor and a first interface, wherein the first microcomputer is connected to a ground, and configured to control an external load, wherein the external load is configured to operate with receipt of electric power supply;
a second microcomputer including a second microprocessor and a second interface, wherein the second microcomputer is connected to the ground, and configured to control the external load;
a first power supply configured to supply electric power to the first microcomputer;
a second power supply configured to supply electric power to the second microcomputer;
a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage;

wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

2. The power supply voltage monitoring circuit as claimed in claim 1, further comprising:

a second reference voltage generation circuit connected between the second power supply and the second microcomputer, and configured to supply a second reference voltage to the second microcomputer in response to a condition that voltage of the second power supply is higher than the second reference voltage;

a second monitoring circuit connected between the first power supply and the second microcomputer, and configured to supply a second monitoring voltage to the second microcomputer, wherein the second microcomputer is configured to monitor voltage of the first power supply based on the supplied second monitoring voltage; and a comparison circuit configured to detect abnormality in the supplied first reference voltage and the supplied second reference voltage by comparison between the supplied first reference voltage and the supplied second reference voltage;

wherein the second microcomputer includes a second voltage abnormality determination part configured to perform a second operation based on the supplied second reference voltage and the supplied second monitoring voltage, wherein the second operation includes detecting abnormality in the voltage of the first power supply and the voltage of the second power supply, and determining which one of the voltage of the first power supply and the voltage of the second power supply is abnormal.

3. The power supply voltage monitoring circuit as claimed in claim 2, further comprising a third microcomputer configured to be supplied with information about the first microcomputer and the second microcomputer, wherein the comparison circuit is provided in the third microcomputer.

4. The power supply voltage monitoring circuit as claimed in claim 3, wherein:

the first microcomputer and the second microcomputer are connected to the third microcomputer through a cable; and a signal from the first microcomputer and a signal from the second microcomputer are alternately sent to the third microcomputer through the cable.

5. The power supply voltage monitoring circuit as claimed in claim 3, wherein:

the third microcomputer includes a power supply section configured to receive electric power supplied from an external device and implement the first power supply and the second power supply based on the supplied electric power from the external device; and the third microcomputer includes an external device voltage monitoring circuit configured to detect abnormality in voltage of the supplied electric power from the external device.

6. The power supply voltage monitoring circuit as claimed in claim 2, wherein:

the comparison circuit is provided in the first microcomputer; and a second comparison circuit is provided in the second microcomputer, wherein the second comparison circuit is configured to detect abnormality in the supplied first reference voltage and the supplied second reference voltage by comparison between the supplied first reference voltage and the supplied second reference voltage.

7. The power supply voltage monitoring circuit as claimed in claim 1, further comprising a first reference voltage monitoring circuit configured to monitor the supplied first reference voltage.

8. The power supply voltage monitoring circuit as claimed in claim 1, further comprising a second monitoring circuit connected between the first power supply and the second microcomputer, and configured to supply a second monitoring voltage to the second microcomputer, wherein the second microcomputer is configured to monitor voltage of the first power supply based on the supplied second monitoring voltage;

wherein the first reference voltage generation circuit is configured to supply the first reference voltage to the second microcomputer; and the second microcomputer includes a second voltage abnormality determination part configured to perform a second operation based on the supplied first reference voltage and the supplied second monitoring voltage, wherein the second operation includes detecting abnormality in the voltage of the first power supply and the voltage of the second power supply, and determining which one of the voltage of the first power supply and the voltage of the second power supply is abnormal.

9. The power supply voltage monitoring circuit as claimed in claim 1, wherein the first monitoring voltage is set different from the first reference voltage.

10. The power supply voltage monitoring circuit as claimed in claim 1, wherein the first monitoring voltage is set lower than the voltage of the first power supply.

11. The power supply voltage monitoring circuit as claimed in claim 1, wherein:

the first voltage abnormality determination part includes a comparator configured to implement the first operation with alternately sampling the supplied first reference voltage and the supplied first monitoring voltage;

the comparator is configured to:

determine that the supplied first reference voltage is normal, in response to a condition that the supplied first reference voltage is within a first region where the supplied first reference voltage is within a first predetermined range of voltage;

determine that the supplied first reference voltage is abnormal, in response to a condition that the supplied first reference voltage is out of the first region;

determine that the supplied first monitoring voltage is normal, in response to a condition that the supplied first monitoring voltage is within a second region where the supplied first monitoring voltage is within a second predetermined range of voltage; and determine that the supplied first monitoring voltage is abnormal, in response to a condition that the supplied first monitoring voltage is out of the second region; and the first region and the second region are set separated from each other.

12. The power supply voltage monitoring circuit as claimed in claim 1, wherein:

the first voltage abnormality determination part includes a comparator configured to implement the first operation with sampling the supplied first reference voltage and the supplied first monitoring voltage; and the comparator is configured to perform sampling of a third voltage while sampling the supplied first reference voltage and the supplied first monitoring voltage, wherein the third voltage is other than the first reference voltage and the first monitoring voltage.

13. A sensor circuit for a vehicle, comprising:

a sensor configured to sense a state of operation of the vehicle;

a first microcomputer including a first microprocessor and a first interface, wherein the first microcomputer is connected to a ground, and configured to control the sensor;

a second microcomputer including a second microprocessor and a second interface, wherein the second microcomputer is connected to the ground, and configured to control the sensor;

a first power supply configured to supply electric power to the first microcomputer;

a second power supply configured to supply electric power to the second microcomputer;

a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage;

wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

14. The sensor circuit as claimed in claim 13, wherein:
the sensor includes a first sensor and a second sensor;
the first microcomputer is configured to control the first sensor;
the second microcomputer is configured to control the second sensor;
the first microcomputer is configured to provide the vehicle with a value of the first sensor as a normal value, in response to a condition that the first voltage abnormality determination part has detected abnormality in the voltage of the second power supply; and
the second microcomputer is configured to provide the vehicle with a value of the second sensor as a normal value, in response to a condition that the first voltage abnormality determination part has detected abnormality in the voltage of the first power supply.

15. The sensor circuit as claimed in claim 14, wherein the sensor is a steering angle sensor configured to sense a rotation angle of a steering wheel of the vehicle.

16. The sensor circuit as claimed in claim 14, wherein the sensor is a torque sensor configured to sense steering torque.

17. A power steering apparatus comprising:

a steering mechanism configured to steer a steered wheel in accordance with steering operation of a steering wheel;

an electric motor configured to apply a steering force to the steering mechanism;

a sensor configured to sense a state of steering of the steering mechanism;

a motor control circuit configured to control drive of the electric motor based on the sensed state of steering of the steering mechanism;

a first microcomputer including a first microprocessor and a first interface, wherein the first microcomputer is connected to a ground, and configured to control the sensor;

a second microcomputer including a second microprocessor and a second interface, wherein the second microcomputer is connected to the ground, and configured to control the sensor;

a first power supply configured to supply electric power to the first microcomputer;

a second power supply configured to supply electric power to the second microcomputer;

a first reference voltage generation circuit connected between the first power supply and the first microcomputer, and configured to supply a first reference voltage to the first microcomputer in response to a condition that voltage of the first power supply is higher than the first reference voltage; and a first monitoring circuit connected between the second power supply and the first microcomputer, and configured to supply a first monitoring voltage to the first microcomputer, wherein the first microcomputer is configured to monitor voltage of the second power supply based on the supplied first monitoring voltage;

wherein the first microcomputer includes a first voltage abnormality determination part configured to perform a first operation based on the supplied first reference voltage and the supplied first monitoring voltage, wherein the first operation includes detecting abnormality in the voltage of the first power supply and the voltage of the second power supply, and determining which one of the voltage of the first power supply and the voltage of the second power supply is abnormal.

18. The power steering apparatus as claimed in claim 17, wherein:
the sensor includes a first sensor and a second sensor;
the first microcomputer is configured to control the first sensor;
the second microcomputer is configured to control the second sensor;
the motor control circuit is configured to continue to control drive of the electric motor based on an output of the first sensor, in response to a condition that the first voltage abnormality determination part has detected abnormality in the voltage of the second power supply; and
the motor control circuit is configured to continue to control drive of the electric motor based on an output of the second sensor, in response to a condition that the first voltage abnormality determination part has detected abnormality in the voltage of the first power supply.

19. The power steering apparatus as claimed in claim 18, wherein the motor control circuit is configured to gradually reduce an assist force of the electric motor, while continuing to control drive of the electric motor based on the output of one of the first sensor and the second sensor in response to the condition that the first voltage abnormality determination part has detected abnormality in one of the voltage of the voltage of the first power supply and the second power supply.

20. The power steering apparatus as claimed in claim 17, wherein:
- the sensor includes a steering angle sensor including a first steering angle sensor and a second steering angle sensor, and a steering torque sensor including a first steering torque sensor and a second steering torque sensor;
- the first steering angle sensor and the first steering torque sensor are driven by the first power supply; and
- the second steering angle sensor and the second steering torque sensor are driven by the second power supply.

\* \* \* \* \*